(12) United States Patent
Bonart

(10) Patent No.: US 11,955,064 B1
(45) Date of Patent: Apr. 9, 2024

(54) MULTI-PIXEL LED ARRANGEMENTS

(71) Applicant: Infineon Technologies AG, Neubiberg (DE)

(72) Inventor: Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/046,115

(22) Filed: Oct. 12, 2022

(51) Int. Cl.
*H01L 25/16* (2023.01)
*G09G 3/32* (2016.01)
*H01L 25/075* (2006.01)
*H01L 27/15* (2006.01)
*H01L 33/62* (2010.01)

(52) U.S. Cl.
CPC ............ *G09G 3/32* (2013.01); *H01L 25/0753* (2013.01); *H01L 25/167* (2013.01); *H01L 27/156* (2013.01); *H01L 33/62* (2013.01); *G09G 2320/0233* (2013.01)

(58) Field of Classification Search
CPC .. G09G 3/32; G09G 2320/0233; G09G 3/006; G09G 3/2003; H01L 25/0753; H01L 33/62; H01L 27/156

USPC ......................................................... 315/161
See application file for complete search history.

(56) References Cited

U.S. PATENT DOCUMENTS

| | | | |
|---|---|---|---|
| 2016/0163256 A1* | 6/2016 | Hochman | G09G 3/2003 315/161 |
| 2022/0180808 A1* | 6/2022 | Richter | G09G 3/006 |
| 2023/0069670 A1* | 3/2023 | Li | H01L 27/156 |

* cited by examiner

*Primary Examiner* — Abdul-Samad A Adediran
(74) *Attorney, Agent, or Firm* — Shumaker & Sieffert, P.A.

(57) ABSTRACT

A system may include a set of light-emitting diode (LED) circuits, wherein each LED circuit of the set of LED circuits comprises: a first electrode; a set of second electrodes; and a set of pixels, wherein each pixel of the set of pixels corresponds to a combination of the first electrode and a respective second electrode of the set of second electrodes. A plurality of pixels may include the set of pixels corresponding to each LED circuit of the set of LED circuits. The first electrode may be located within a center portion of the respective LED circuit, and each second electrode of the set of second electrodes may be located within an outer portion the respective LED circuit. The system also includes a controller circuit configured to control whether each pixel of the plurality of pixels is activated or deactivated.

21 Claims, 9 Drawing Sheets

MULTI-PIXEL LED ARRANGEMENTS

TECHNICAL FIELD

This disclosure relates to light-emitting diode (LED) circuits.

BACKGROUND

A set of light-emitting diodes (LEDs) may be placed in a formation. A controller may control whether each LED of the set of LEDs is activated or deactivated. For example, the controller may include one or more LED drivers that control the power supplied to each LED of the set of LEDs. The controller may control a brightness of each LED of the set of LEDs and/or a duty cycle of each LED of the set of LEDs by controlling the power supplied to each LED. The controller may control the set of LEDs to display a message on the formation, control an amount of light emitted by the formation, or control other aspects of the formation.

SUMMARY

In general, this disclosure is directed to devices, systems, and techniques for arranging light-emitting diodes (LEDs) in a formation that may decrease or attenuate a presence of brightness variations when one or more LEDs are activated. A formation of LEDs may include brightness variations when the formation includes one or more bright portions that are separated by one or more dark portions. A bright portion on the formation may represent a grouping of one or more LEDs and/or one or more LED pixels that emit light such that the grouping appears as an individual bright area that is separate from other bright areas. A dark portion on the formation may appear as a spot or a gap between bright portions on the formation.

Brightness variations may, in some cases, occur at boundaries between LEDs on the formation of LEDs. For example, when LEDs are arranged in an array having a sequence of rows and a sequence of columns, there may be one or more horizontal boundaries that extend across the array between adjacent rows, and there may be one or more vertical boundaries that extend across the array between adjacent columns. Boundaries that extend across the entire array or a large portion of the array are more likely to cause a visible brightness variation than boundaries between two adjacent LEDs and do not extend across the entire array or a large portion of the array. In other words, it may be beneficial to arrange the LEDs in a formation that decreases a prevalence of long, continuous boundaries between LEDs of the formation.

Each LED of a set of LEDs arranged in a formation may, in some examples, include more than one pixel. For example, a multi-pixel LED may include a single cathode and a set of two or more anodes. Each pixel of the multi-pixel LED may represent a combination of an anode of the two or more anodes and the single cathode. A pixel is activated when current flows from the respective anode of the two or more anodes to the single cathode. A controller may activate or deactivate each pixel of a multi-pixel LED independently of other pixels of the multi-pixel LED. Formations of multi-pixel LEDs may include fewer brightness variations as compared with formations of single-pixel LEDs, because brightness variations are not likely to occur between pixels of a multi-pixel LED. Brightness formations are more likely to occur at boundaries between LEDs in the formation.

The techniques of the disclosure may provide one or more advantages. For example, systems that arrange LEDs in a formation that decreases a prevalence of boundaries between LEDs that extend across the formation may decrease a prevalence of brightness variations as compared with system that arrange LEDs in a formation that creates continuous boundaries. Systems that use multi-pixel LEDs may include fewer brightness variations as compared with systems that use single-pixel LEDs.

In one example, a system includes a set of light-emitting diode (LED) circuits, wherein each LED circuit of the set of LED circuits comprises: a first electrode; a set of second electrodes; and a set of pixels. Each pixel of the set of pixels may correspond to a combination of the first electrode and a respective second electrode of the set of second electrodes, wherein a plurality of pixels includes the set of pixels corresponding to each LED circuit of the set of LED circuits, wherein the first electrode is located within a center portion of the respective LED circuit of the set of LED circuits, and wherein each second electrode of the set of second electrodes is located within an outer portion the respective LED circuit of the set of LED circuits; Additionally, the system includes a controller circuit configured to control whether each pixel of the plurality of pixels is activated or deactivated.

In another example, an LED circuit includes a first electrode; a set of second electrodes; and a set of pixels, wherein each pixel of the set of pixels corresponds to a combination of the first electrode and a respective second electrode of the set of second electrodes, wherein the first electrode is located within a center portion of the LED circuit, and wherein each second electrode of the set of second electrodes is located within an outer portion the LED circuit.

In another example, a method comprises controlling, by a controller circuit, whether each pixel of a plurality of pixels is activated or deactivated, wherein each LED circuit of a set of LED circuits comprises: a first electrode; a set of second electrodes; and a set of pixels, wherein each pixel of the set of pixels corresponds to a combination of the first electrode and a respective second electrode of the set of second electrodes. The plurality of pixels includes the set of pixels may correspond to each LED circuit of the set of LED circuits, wherein the first electrode is located within a center portion of the respective LED circuit of the set of LED circuits, and wherein each second electrode of the set of second electrodes is located within an outer portion the respective LED circuit of the set of LED circuits.

In another example, a system includes a set of LED circuits, wherein each LED circuit of the set of LED circuits comprises: a first electrode; a set of second electrodes; and a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of the respective LED circuit of the set of LED circuits, and wherein each second electrode of the set of second electrodes is located within an outer portion the respective LED circuit of the set of LED circuits.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

Like reference characters refer to like elements throughout the figures and description.

DETAILED DESCRIPTION

Formations of light-emitting diodes (LEDs) may emit light when one or more LEDs of the formation are activated. In some examples, each LED present in a formation may include two or more pixels. An LED including two or more pixels may be referred to herein as a "multi-pixel LED." In some examples, a controller may control whether each LED of a set of LEDs present in a formation is activated or deactivated. In some examples, when a grouping of LEDs is activated on the formation, that grouping may include brightness variations. Some LED formations that prevent continuous boundaries between LEDs may include fewer brightness variations as compared with LED formations that include continuous boundaries between LEDs. This is because a boundary between LEDs does not emit light. Consequently, when adjacent LEDs are activated, the boundary between the adjacent LEDs may appear darker than the LEDs themselves. Furthermore, formations of multi-pixel LEDs may be less likely to exhibit brightness variations than formations of single-pixel LEDs, because brightness variations are not likely to occur between adjacent pixels of the same LED.

Figure 1:
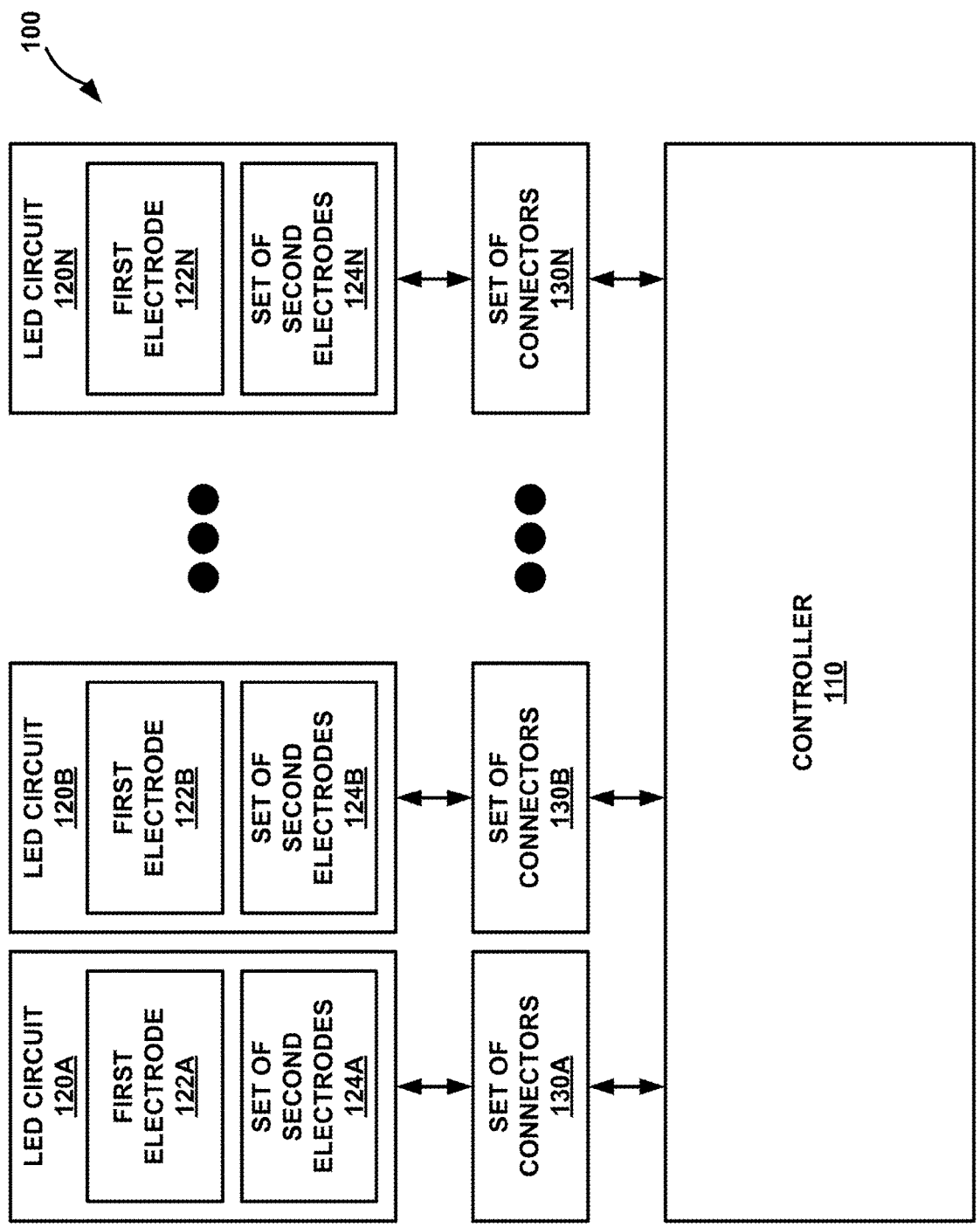
FIG. 1 is a block diagram illustrating an example system for controlling a formation of light-emitting diodes (LEDs) comprising a plurality of pixels, in accordance with one or more techniques of this disclosure.

FIG. 1 is a block diagram illustrating an example system 100 for controlling a formation of LEDs comprising a plurality of pixels, in accordance with one or more techniques of this disclosure. As seen in FIG. 1, system 100 includes controller 110, LED circuits 120A-120N (collectively, "LED circuits 120"), and sets of connectors 130A-130N (collectively, "sets of connectors 130"). Each LED circuit of LED circuits 120 may include a first electrode and a set of second electrodes. For example, LED circuit 120A includes a first electrode 122A and a set of second electrodes 124A, LED circuit 120B includes a first electrode 122B and a set of second electrodes 124B, and LED circuit 120N includes a first electrode 122N and a set of second electrodes 124N.

Controller 110 may be configured to control a plurality of pixels that are formed by LED circuits 120. For example, LED circuits 120 may be placed in a two-dimensional (2D) formation including the plurality of pixels. Controller 110 may control whether each pixel of the plurality of pixels is activated or deactivated. This means that controller 110 may control the plurality of pixels to display a message and/or occupy one or more settings (e.g., brightness settings, blinking settings, color settings) by individually controlling each pixel to manage the light output of the formation.

Controller 110 may, in some examples, include processing circuitry (not illustrated in FIG. 1). The processing circuitry may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, the processing circuitry may include any suitable structure, whether in hardware, software, firmware, or any combination thereof, to perform the functions ascribed herein to system 100.

The processing circuitry may be in communication with a memory (not illustrated in FIG. 1). In some examples, the memory in communication with the processing circuitry includes computer-readable instructions that, when executed by the processing circuitry, cause system 100 to perform various functions attributed to system 100 herein. The memory may include any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media.

In some examples, controller 110 includes a plurality of driver circuits. Each driver circuit of the plurality of driver circuits may control whether a respective pixel of the plurality of pixels of LED circuits 120 is activated or deactivated. For example, each driver circuit of the one or more driver circuits may include one or more switching devices. Processing circuitry of controller 110 may control whether the each switching device of the one or more switching devices is on or off, thus controlling whether electrical current flows through the driver circuit to the respective pixel.

In some examples, each switching device of the one or more switching devices may comprise a power switch such as, but not limited to, any type of field-effect transistor (FET) including any one or combination of a metal-oxide-semiconductor field-effect transistor (MOSFET), a bipolar junction transistor (BJT), an insulated-gate bipolar transistor (IGBT), a junction field effect transistor (JFET), a high electron mobility transistor (HEMT), or other kinds of elements that use voltage or current for control. Additionally, driving device 24A may include any one or combination of n-type transistors, p-type transistors, and power transistors. In some examples, a switching device of a driver circuit may include vertical transistors, lateral transistors, and/or horizontal transistors. In some examples, a switching device may include other analog devices such as diodes and/or thyristors. In some examples, a switching device may operate as a switch and/or operate as an analog device.

In some examples, a switching device of a driver circuit of controller 110 includes three terminals: two load terminals and a control terminal. When a switching device represents a MOSFET, the switching device may include a drain terminal, a source terminal, and at least one gate terminal, where the control terminal is a gate terminal. When a switching device represents a BJT switch, the control terminal may represent a base terminal. Current may flow between the two load terminals of the witching device based on the voltage at the respective control terminal. Therefore, electrical current may flow across the switching device based on control signals delivered to the control terminal of the switching device. In one example, if a voltage applied to the control terminal of the switching device is greater than or equal to a voltage threshold, the switching device may be activated, allowing the switching device to conduct electricity. Furthermore, the switching device may be deactivated when the voltage applied to the control terminal of the switching device is below the threshold voltage, thus preventing the switching device from conducting electricity.

Switching devices may include various material compounds, such as Silicon, Silicon Carbide, Gallium Nitride, or any other combination of one or more semiconductor materials. In some examples, silicon carbide switches may experience lower switching power losses. Improvements in magnetics and faster switching, such as Gallium Nitride switches, may allow a switching device to draw short bursts of current. These higher frequency devices may require control signals (e.g., voltage signals delivered to the control terminal of the switching device) to be sent with more precise timing, as compared to lower-frequency devices.

Processing circuitry of controller 110 may be configured to control the one or more switching devices of each driver circuit of the plurality of driver circuits. For example, the processing circuitry may activate one or more switching devices of a driver circuit in order to allow current to flow to a respective pixel of LED circuits 120, thus activating the pixel and causing the pixel to emit light. Additionally, or alternatively, the processing circuitry may activate one or more switching devices of a driver circuit in order to prevent current from flowing to a respective pixel of LED circuits 120, thus deactivating the pixel and preventing the pixel from emitting light.

LED circuits 120 each include a first electrode and a set of second electrodes. For example, each LED circuit of LED circuits 120A-120N may include a respective first electrode of first electrodes 122A-122N, and each LED circuit of LED circuits 120A-120N may include a respective set of second electrodes of the sets of second electrodes 124A-124N. Each LED circuit of LED circuits 120 may represent a multi-pixel LED. That is, each LED circuit of LED circuits 120 may represent a single LED comprising two or more pixels. LED circuit 120A, for example, includes first electrode 122A and the set of second electrodes 124A. In some examples, the first electrode 122A represents a single electrode, and the set of second electrodes 124A includes two or more electrodes. Each combination between the first electrode 122A and a second electrode of the set of second electrodes 124A represents a respective pixel of a multi-pixel LED formed by LED circuit 120A. In other words, LED circuit 120A includes a number of pixels that is equal to a number of electrodes in the set of second electrodes 124A.

An LED may generally represent a semiconductor device that is configured to emit light when current flows through the LED from an anode to a cathode. Single-pixel LEDs may include a single anode and a single cathode, and emit light when electrical current flows through the single-pixel LED from the single anode to the single cathode. In some examples, a multi-pixel LED may include a single cathode and two or more anodes. Each pixel of a multi-pixel LED may correspond to a combination of an anode of the two or more anodes and the single cathode. That is, when a multi-pixel LED includes two anodes, the LED comprises two pixels, each pixel corresponding to a combination of an anode and the single cathode. In some examples, first electrodes 122 may represent cathodes and sets of second electrodes 124 may represent anodes. In some examples, each LED circuit of LED circuits 120 may comprise a semiconductor material (e.g., Gallium Nitride).

The techniques described herein are not limited to examples where an LED circuit includes more than one anode and a single cathode. In some examples, a multi-pixel LED may include a single anode and two or more cathodes. Each pixel of a multi-pixel LED may correspond to a combination of a cathode of the two or more anodes and the anode cathode. That is, when a multi-pixel LED includes two cathodes, the LED comprises two pixels, each pixel corresponding to a combination of a cathode and the single anode. In some examples, first electrodes 122 may represent anodes and sets of second electrodes 124 may represent cathodes.

Controller 110 may control whether each individual pixel of a formation of multi-pixel LEDs is activated or deactivated. For example, controller 110 may include a driver circuit corresponding to each pixel of the formation of multi-pixel LEDs. The driver circuit corresponding to the pixel may be configured to control whether current flows to the anode corresponding to that respective pixel. For example, when processing circuitry of controller 110 activates a driver circuit of controller 110, allowing current to flow to the anode of the corresponding pixel, the pixel may be activated. When processing circuitry of controller 110 deactivates a driver circuit of controller 110, preventing current from flowing to the anode of the corresponding pixel, the pixel may be deactivated.

The set of LED circuits 120 may be arranged to create a formation of multi-pixel LEDs. The formation of multi-pixel LEDs may represent a close grouping of LEDs such that edges of LEDs are flush with edges of other LEDs. This ensures that the only gaps in the formation of multi-pixel LEDs are small spaces between parallel LED edges. These small gaps between parallel LED edges may be referred to herein as "boundaries." In some examples, it may be beneficial to arrange LED circuits 120 in order to reduce or eliminate straight boundaries that extend across the entire formation or across a large portion of the formation. Straight, long boundaries between LEDs that extend across the formation may be more likely to introduce brightness variations than short boundaries that do not extend across significant portions of the formation.

In some examples, each LED circuit of LED circuits 120 may include two or more pixels. In some examples, each LED circuit of LED circuits 120 may include the same number of pixels as other LED circuits of LED circuits 120, but this is not required. In some examples, one or more LED circuits of LED circuits 120 may include a different number of pixels than one or more other LED circuits of LED circuits 120.

In some examples, the first electrode of each LED circuit of LED circuits 120 may be located in a central portion of the respective LED circuit. The set of second electrodes may be located in outer portions of the respective LED circuit. For example, LED circuit 120A may include first electrode 122A located in a central portion of the LED circuit. Each second electrode of the set of second electrodes 124A may be located at an outer portion of LED circuit 120A. Arranging the electrodes so that the first electrode is in the center of the LED circuit and the set of second electrodes are located at outer portions of the LED circuit may be beneficial, so that a direct connection may be formed between each second electrode of the set of second electrodes and the first electrode. That is, it may be beneficial for each pixel of an LED circuit to represent a direct connection between a first electrode and a second electrode, without other electrodes being located between the first electrode and the second electrode. LED circuits that include direct connections between the first electrode and the second electrode of each LED pixel may require fewer materials per pixel as compared with LED circuits that do not include direct connections between the first electrode and the second electrode of each LED pixel.

LED circuits 120 may, in some examples, each include two pixels. For example, LED circuit 120A may include a single first electrode 122A, and a set of second electrodes 124A including two electrodes. The first electrode 122A may be located in a central portion of the LED circuit 120A. One of the set of second electrodes 124A may be located in a left outer portion of LED circuit 120A, and one of the set of second electrodes 124A may be located in a right outer portion of LED circuit 120A. In other words, the first electrode 122A is located between the two second electrodes 124A. This means that a direct connection exists between the first electrode 122A and the second electrode located in the left outer portion, and a direct connection exists between the first electrode 122A and the second electrode located in the right outer portion. A first pixel corresponds to the combination of the first electrode 122A and the second electrode located in the left outer portion, and a second pixel corresponds to the first electrode 122A and the second electrode located in the right outer portion. Controller 110 may activate the first pixel by allowing electrical current to flow to the second electrode located in the left outer portion, and controller 110 may activate the second pixel by allowing electrical current to flow to the second electrode located in the right outer portion.

In some examples where each LED circuit of LED circuits 120 includes two pixels, LED circuits 120 may be arranged in a 2D array having a sequence of rows and a sequence of columns. In this case, there may be horizontal and vertical boundaries extending across the array. Although horizontal and vertical boundaries extending across the array may introduce brightness variations, using LED circuits 120 including two pixels may decrease a prevalence of brightness variations as compared with LED circuits that include a single pixel because the boundary between two pixels of the same LED is unlikely to cause a brightness variation.

In some examples where each LED circuit of LED circuits 120 includes two pixels, LED circuits 120 may be arranged in a 2D array having a sequence of overlapping rows. That is, there may be horizontal boundaries extending across the array, but the rows may be overlapped such that there are not vertical boundaries extending across the array. In some examples where each LED circuit of LED circuits 120 includes two pixels, LED circuits 120 may be arranged in a 2D array having a sequence of overlapping columns. That is, there may be vertical boundaries extending across the array, but the columns may be overlapped such that there are not horizontal boundaries extending across the array. Overlapping rows and/or columns to eliminate horizontal and/or vertical boundaries extending across the array may decrease a prevalence of brightness variations as compared with arrays that do not overlap rows or boundaries.

LED circuits 120 may, in some examples, each include three pixels. For example, LED circuit 120A may include a single first electrode 122A, and a set of second electrodes 124A including three electrodes. The first electrode 122A may be located in a central portion of the LED circuit 120A. One of the set of second electrodes 124A may be located in a first corner portion of LED circuit 120A, another one of the set of second electrodes 124A may be located in a second corner portion of LED circuit 120A, and another one of the set of second electrodes 124A may be located in a third corner portion of LED circuit 120A. LED circuit 120A may be shaped as a triangle comprising three corners when the set of second electrodes 124A includes three electrodes. The first electrode 122A may be located in a center of the triangle, and each of the second electrodes 124A may be located in a corner portion of a triangle. This means that a direct connection exists between the first electrode 122A and each of the second electrodes located in a corner portion of the triangle. A first pixel may correspond to the combination of the first electrode 122A and the second electrode located in the first corner portion, a second pixel corresponds to the combination of the first electrode 122A and the second electrode located in the second corner portion, and a third pixel corresponds to the combination of the first electrode 122A and the third electrode located in the third corner portion.

In examples where LED circuit 120A includes three pixels, controller 110 may activate the first pixel by allowing electrical current to flow to the second electrode located in the first corner portion, controller 110 may activate the second pixel by allowing electrical current to flow to the second electrode located in the second corner portion, and controller 110 may activate the third pixel by allowing electrical current to flow to the second electrode located in the third corner portion. In some examples where LED circuits 120 each comprise a triangle-shaped LED having three pixels, LED circuits 120 are arranged in a triangular lattice such that edges of each LED circuit of LED circuits 120 are configured to be flush with an edge of another LED circuit of LED circuits 120.

LED circuits 120 may, in some examples, each include four pixels. For example, LED circuit 120A may include a single first electrode 122A, and a set of second electrodes 124A including four electrodes. The first electrode 122A may be located in a central portion of the LED circuit 120A. One of the set of second electrodes 124A may be located in a first corner portion of LED circuit 120A, another one of the set of second electrodes 124A may be located in a second corner portion of LED circuit 120A, another one of the set of second electrodes 124A may be located in a third corner portion of LED circuit 120A, and another one of the set of second electrodes 124A may be located in a fourth corner portion of LED circuit 120A. LED circuit 120A may be shaped as a rectangle comprising four corners when the set of second electrodes 124A includes four electrodes. The first electrode 122A may be located in a center of the rectangle, and each of the second electrodes 124A may be located in a corner portion of the rectangle. This means that a direct connection exists between the first electrode 122A and each of the second electrodes located in a corner portion of the rectangle.

In examples where LED circuit 120A comprises four second electrodes, a first pixel may correspond to the combination of the first electrode 122A and the second electrode located in the first corner portion, a second pixel corresponds to the combination of the first electrode 122A and the second electrode located in the second corner portion, a third pixel corresponds to the combination of the first electrode 122A and the third electrode located in the second corner portion, and a fourth pixel corresponds to the combination of the first electrode 122A and the fourth electrode located in the second corner portion. The four pixels may be located on the LED circuit 120A in a 2×2 (two rows and two columns) arrangement.

In examples where LED circuit 120A includes four pixels, controller 110 may activate the first pixel by allowing electrical current to flow to the second electrode located in the first corner portion, controller 110 may activate the second pixel by allowing electrical current to flow to the second electrode located in the second corner portion, controller 110 may activate the third pixel by allowing electrical current to flow to the second electrode located in the third corner portion, and controller 110 may activate the fourth pixel by allowing electrical current to flow to the second electrode located in the fourth corner portion. In some examples where LED circuits 120 each comprise a rectangular-shaped LED having four pixels, LED circuits 120 are arranged in a formation such that edges of each LED circuit of LED circuits 120 are configured to be flush with an edge of one or more other LED circuits of LED circuits 120.

LED circuits 120 may, in some examples, each include six pixels. For example, LED circuit 120A may include a single first electrode 122A, and a set of second electrodes 124A including six electrodes. The first electrode 122A may be located in a central portion of the LED circuit 120A. One of the set of second electrodes 124A may be located in a first corner portion of LED circuit 120A, another one of the set of second electrodes 124A may be located in a second corner portion of LED circuit 120A, another one of the set of second electrodes 124A may be located in a third corner portion of LED circuit 120A, another one of the set of second electrodes 124A may be located in a fourth corner portion of LED circuit 120A, another one of the set of second electrodes 124A may be located in a fifth corner portion of LED circuit 120A, and another one of the set of second electrodes 124A may be located in a sixth corner portion of LED circuit 120A. LED circuit 120A may be shaped as a hexagon comprising six corners when the set of second electrodes 124A includes six electrodes.

In examples, where the set of second electrodes 124A includes six electrodes, the first electrode 122A may be located in a center of a hexagon, and each of the second electrodes 124A may be located in a corner portion of the hexagon. This means that a direct connection exists between the first electrode 122A and each of the second electrodes located in a corner portion of the hexagon. A first pixel may correspond to the combination of the first electrode 122A and the second electrode located in the first corner portion, a second pixel may correspond to the combination of the first electrode 122A and the second electrode located in the second corner portion, a third pixel may correspond to the combination of the first electrode 122A and the third electrode located in the third corner portion, a fourth pixel may correspond to the combination of the first electrode 122A and the fourth electrode located in the fourth corner portion, a fifth pixel may correspond to the combination of the first electrode 122A and the fifth electrode located in the fifth corner portion, and a sixth pixel may correspond to the combination of the first electrode 122A and the sixth electrode located in the sixth corner portion.

In examples where LED circuit 120A includes six pixels, controller 110 may individually control each of the six pixels by controlling whether current flows to each respective second electrode of second electrodes 124A. In some examples where LED circuits 120 each comprise a hexagonal-shaped LED having six pixels, LED circuits 120 are arranged in a hexagonal lattice such that edges of each LED circuit of LED circuits 120 are configured to be flush with an edge of another LED circuit of LED circuits 120.

Each set of connectors of the sets of connectors 130A-130N may include a number of connectors equal to a total number of electrodes in the respective LED circuit of LED circuits 120. For example, when LED circuit 120A includes a single first electrode 122A and four second electrodes 124A, the set of connectors 130A may include five connectors. In some examples, each connector of the sets of connectors 130A-130N may include a conductive material (e.g., copper).

Figure 2:
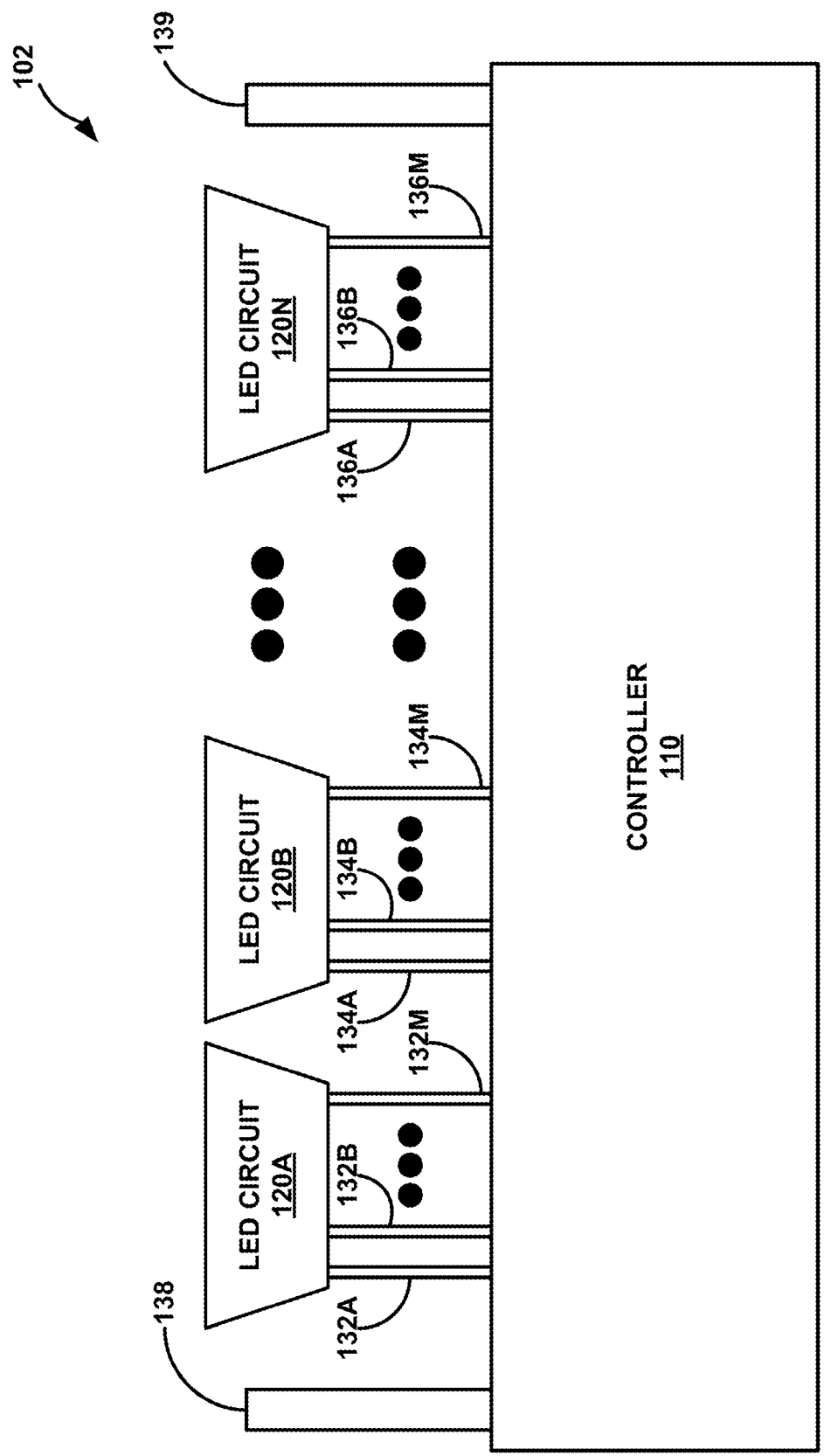
FIG. 2 is a block diagram illustrating an example system for using a controller to control a plurality of pixels via conductive connectors, in accordance with one or more techniques of this disclosure.

FIG. 2 is a block diagram illustrating an example system 102 for using a controller 110 to control a plurality of pixels via conductive connectors, in accordance with one or more techniques of this disclosure. As seen in FIG. 1, system 102 includes controller 110 and LED circuits 120. System 102 includes a set of connectors 132A-132M that connect controller 110 to LED circuit 120A, a set of connectors 134A-134M that connect controller 110 to LED circuit 120B, and a set of connectors 136A-136M that connect controller 110 to LED circuit 120N. System 102 also includes pads 138 and pads 139. In some examples, system 102 of FIG. 2 is substantially the same as system 100 of FIG. 1, except that FIG. 2 includes pads 138, 139 without illustrating the first and second electrodes of LED circuits 120.

In some examples, each LED circuit of LED circuits 120 may be connected to a respective set of connectors. A set of connectors corresponding to an LED circuit may include a number of connectors equal to a number of electrodes of the respective LED circuit. For example, when LED circuit 120A includes a first electrode and a set of two second electrodes, the set of connectors 132 may include three connectors, when LED circuit 120A includes a first electrode and a set of three second electrodes, the set of connectors 132 may include four connectors, when LED circuit 120A includes a first electrode and a set of three second electrodes, the set of connectors 132 may include four connectors, when LED circuit 120A includes a first electrode and a set of four second electrodes, the set of connectors 132 may include five connectors, and when LED circuit 120A includes a first electrode and a set of six second electrodes, the set of connectors 132 may include six connectors.

In some examples, each connector of a set of connectors may connect controller 110 with a respective electrode of the corresponding LED circuit. For example, when LED circuit 120A includes a first electrode and a set of three second electrodes, a first connector of the set of connectors 132 may connect controller 110 to the first electrode 122A, a second connector of the set of connectors 132 may connect controller 110 to one of the set of second electrodes 124A, a third connector of the set of connectors 132 may connect controller 110 to another one of the set of second electrodes 124A, a fourth connector of the set of connectors 132 may connect controller 110 to another one of the set of second electrodes 124A, and a fourth connector of the set of connectors 132 may connect controller 110 to another one of the set of second electrodes 124A. By including a connector for each electrode of an LED circuit, system 102 may allow controller 110 to individually activate and/or deactivate each pixel of the LED circuit. In some examples, pads 138, 139 may provide power to the set of LED circuits 120. In some examples, one of pads 138, 139 may comprise a ground node, and one of pads 138, 139 may comprise a power node.

Figure 3:
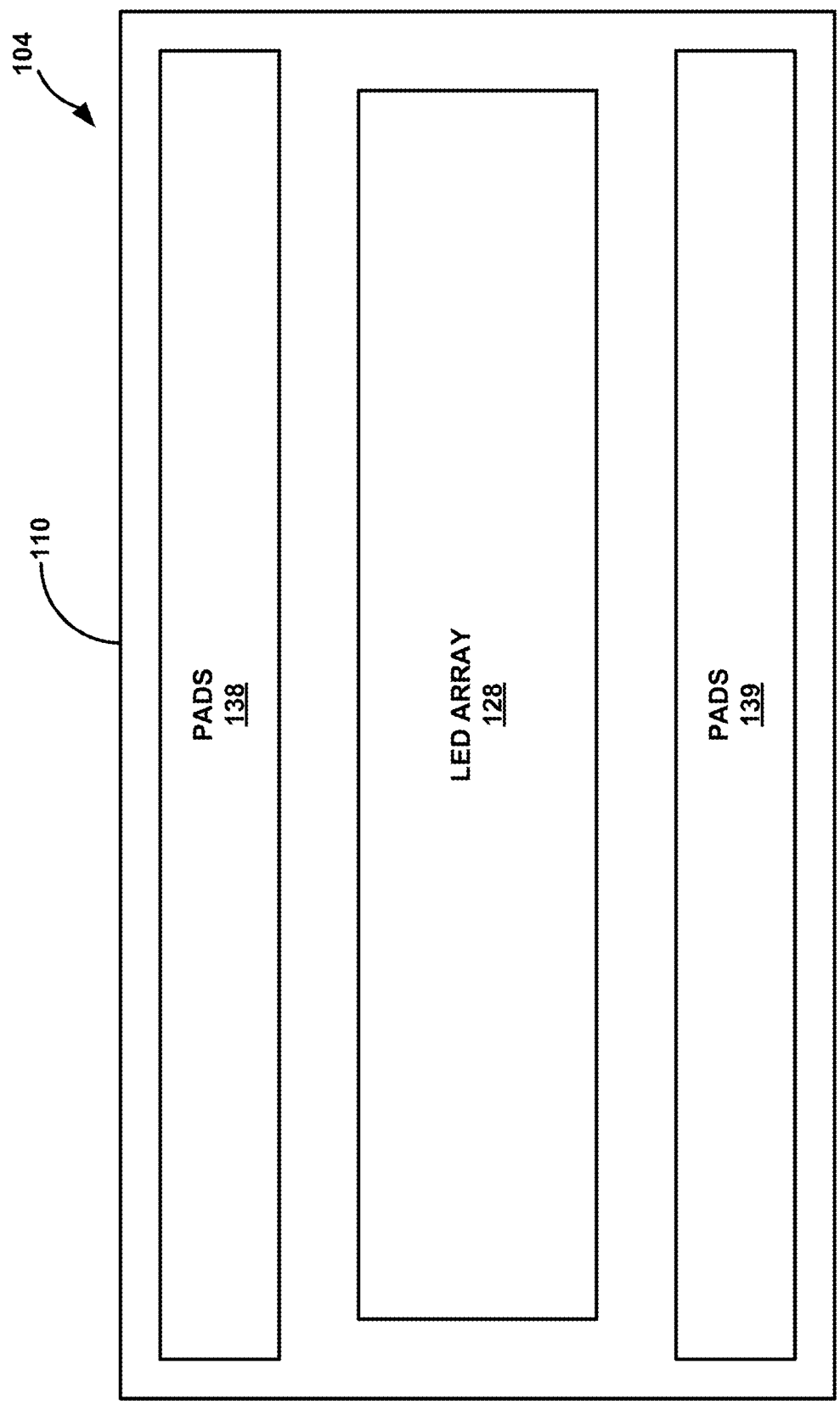
FIG. 3 is a block diagram illustrating an example system for using a controller to control an LED array, in accordance with one or more techniques of this disclosure.

FIG. 3 is a block diagram illustrating an example system 104 for using a controller 110 to control an LED array 128, in accordance with one or more techniques of this disclosure. As seen in FIG. 3, system 104 includes controller 110, LED array 128, pads 138, and pads 139. System 104 of FIG.

3 may represent a top-down view of the system 102 illustrated by FIG. 2. For example, LED array 128 may comprise a 2D formation of the set of LED circuits 120 of FIGS. 1-2. Although system 104 may include one or more connectors, connectors are not visible in the perspective of FIG. 3 because the connectors are located between controller 110 and LED array 128. That is, LED array 128 is located above controller 110 from the perspective of FIG. 3, and connectors are located between controller 110 and LED array 128. Pads 138, 139 may provide power to LED array 128. For example, an electrical current may flow between pads 138 and pads 139 across LED array 128.

Figure 4A:
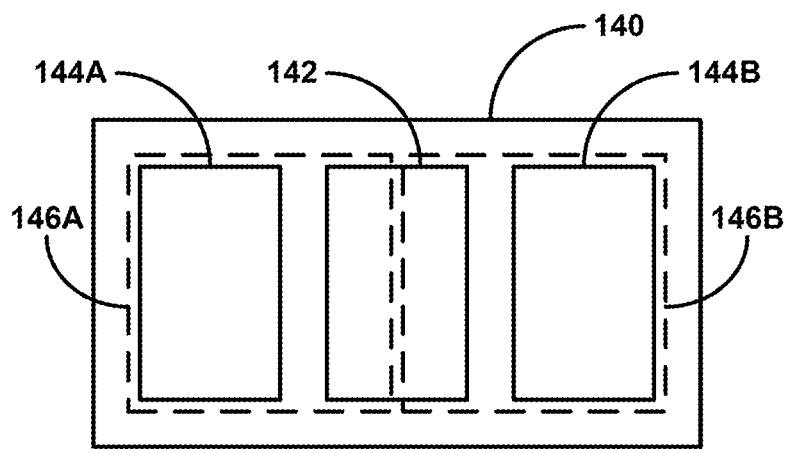
FIGS. 4A-4C are conceptual diagrams each illustrating an example configuration of electrodes on an LED circuit of the set of the LED circuits of FIGS. 1-2, in accordance with one or more techniques of this disclosure.
Figure 4B:
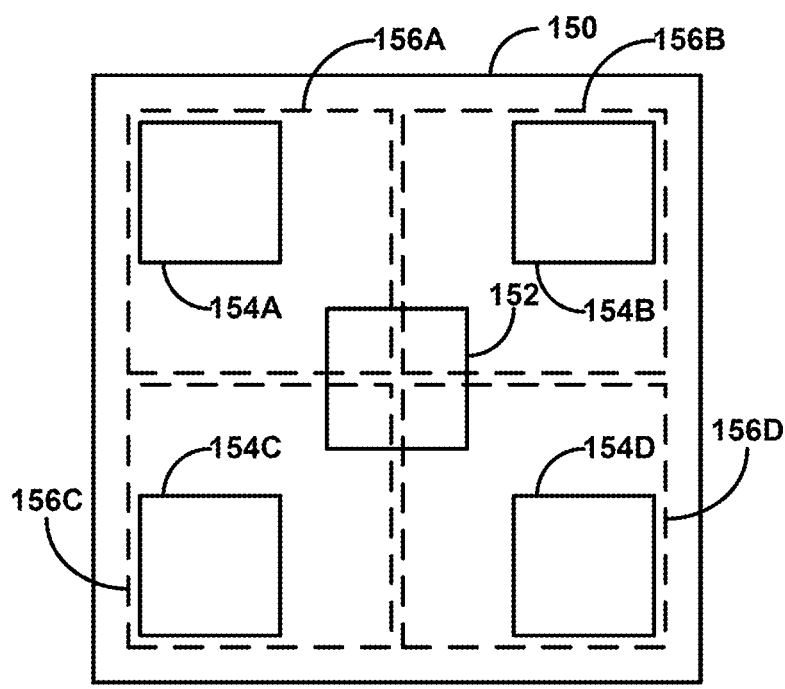
Figure 4C:
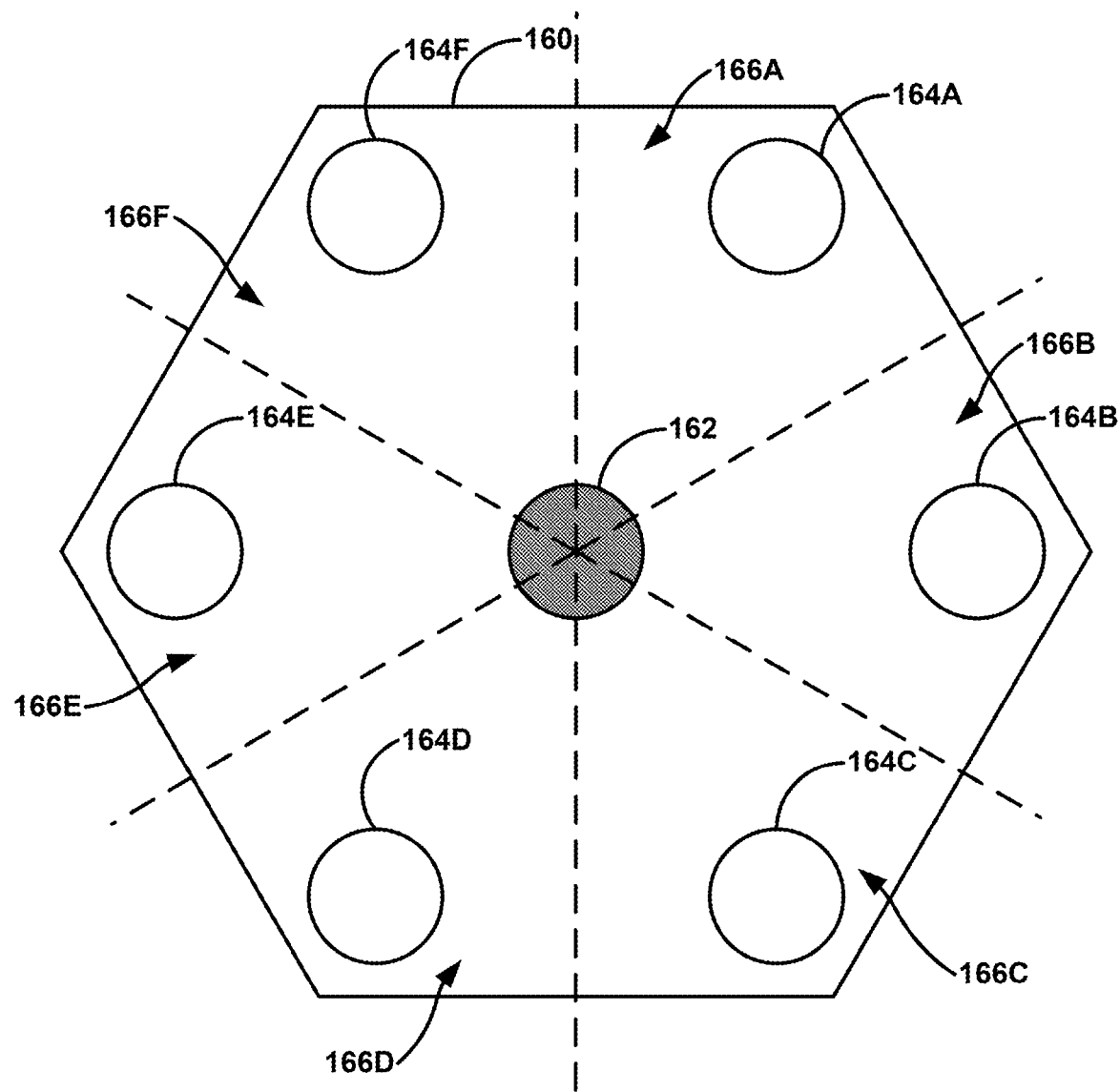

FIGS. 4A-4C are conceptual diagrams each illustrating an example configuration of electrodes on an LED circuit of the set of LED circuits 120 of FIGS. 1-2, in accordance with one or more techniques of this disclosure. In some examples, each LED circuit of LED circuits 120 may have the same configuration of electrodes, but this is not required. In some examples, one or more LED circuits of LED circuits 120 may comprise an electrode configuration that is different than one or more other LED circuits of LED circuits 120.

FIG. 4A is a conceptual diagram illustrating an example LED circuit 140 comprising two pixels. In some examples, LED circuit 140 is an example of an LED circuit of the set of LED circuits 120 of FIGS. 1-2. As seen in FIG. 4A, LED circuit 140 includes a first electrode 142, a set of two second electrodes 144A-144B, and a set of two pixels 146A-146B. LED circuit 140 may be shaped as a rectangle. First electrode 142 may be located in a central portion of the rectangle. Each second electrode of the set of second electrodes 144A-144B may be located within an outer portion of the rectangle. First pixel 146A represents a combination of the first electrode 142 and the second electrode 144A, and second pixel 146B represents a combination of the first electrode 142 and the second electrode 144B. This means that first electrode 142 and the set of second electrodes 144A-144B form two adjacent pixels on the same LED circuit 140. A controller, such as controller 110 may individually control whether first pixel 146A and second pixel 146B are activated and/or deactivated.

In some examples, the first electrode 142 may comprise a cathode and each second electrode of the set of second electrodes 144A-144B may comprise an anode. Electrical current may flow across an LED circuit from an anode to a cathode. This means that electrical current may be configured to flow from second electrode 144A to first electrode 142, and electrical current may be configured to flow from second electrode 144B to first electrode 142. When an electrical current flows from an anode to a cathode corresponding to a pixel, the pixel may be activated and emit light. When electrical current does not flow from an anode to a cathode corresponding to a pixel, the pixel may be deactivated and not emit light. Controller 110 may be configured to individually control whether current flows from second electrode 144A to first electrode 142 and whether electrical current flows from second electrode 144B to first electrode 142.

FIG. 4B is a conceptual diagram illustrating an example LED circuit 150 comprising four pixels. In some examples, LED circuit 150 is an example of an LED circuit of the set of LED circuits 120 of FIGS. 1-2. As seen in FIG. 4A, LED circuit 150 includes a first electrode 152, a set of four second electrodes 154A-154D, and a set of four pixels 156A-156D. LED circuit 140 may be shaped as a rectangle, where the pixels 156A-156D are located on the rectangle. In some examples, LED circuit 140 may be shaped as a square. First electrode 152 may be located within a central portion of the rectangle. Each second electrode of the set of second electrodes 154A-154D may be located in an outer portion (e.g., a corner portion) of the square. First pixel 156A represents a combination of the first electrode 152 and the second electrode 154A, second pixel 156B represents a combination of the first electrode 152 and the second electrode 154B, third pixel 156C represents a combination of the first electrode 152 and the second electrode 154C, and fourth pixel 156D represents a combination of the first electrode 152 and the fourth electrode 154D. This means that first electrode 152 and the set of second electrodes 154A-154D form four pixels on the same LED circuit 150. A controller, such as controller 110 may individually control whether first pixel 156A, second pixel 156B, third pixel 156C, and fourth pixel 156D are activated and/or deactivated.

In some examples, the first electrode 152 may comprise a cathode and each of the set of second electrodes 154A-154D may comprise an anode. Electrical current may flow across an LED circuit from an anode to a cathode. This means that electrical current may be configured to flow from second electrode 154A to first electrode 152, electrical current may be configured to flow from second electrode 154B to first electrode 152, electrical current may be configured to flow from second electrode 154C to first electrode 152, and electrical current may be configured to flow from second electrode 154D to first electrode 152. When an electrical current flows from an anode to a cathode corresponding to a pixel, the pixel may be activated and emit light. When electrical current does not flow from an anode to a cathode corresponding to a pixel, the pixel may be deactivated and not emit light. Controller 110 may be configured to individually control whether current flows from each of the second electrodes 154A-154D to first electrode 152.

FIG. 4C is a conceptual diagram illustrating an example LED circuit 160 comprising six pixels. In some examples, LED circuit 160 is an example of an LED circuit of the set of LED circuits 120 of FIGS. 1-2. As seen in FIG. 4A, LED circuit 160 includes a first electrode 162, a set of six second electrodes 164A-164F, and a set of six pixels 166A-166F. LED circuit 160 may be shaped as a hexagon that forms six sides and six corners. First electrode 162 may be located within a central portion of the hexagon. Each second electrode of the set of second electrodes 164A-164F may be located in an outer portion (e.g., a corner portion) of the hexagon. First pixel 166A represents a combination of the first electrode 162 and the second electrode 164A, second pixel 166B represents a combination of the first electrode 162 and the second electrode 164B, third pixel 166C represents a combination of the first electrode 162 and the second electrode 164C, fourth pixel 166D represents a combination of the first electrode 162 and the fourth electrode 164D, fifth pixel 166E represents a combination of the first electrode 162 and the fifth electrode 164E, and sixth pixel 166F represents a combination of the first electrode 162 and the sixth electrode 164F. This means that first electrode 162 and the set of second electrodes 164A-164F form six pixels on the same LED circuit 160. A controller, such as controller 110, may individually control whether first pixel 166A, second pixel 166B, third pixel 166C, fourth pixel 166D, fifth pixel 166E, and sixth pixel 166F are activated and/or deactivated.

In some examples, the first electrode 162 may comprise a cathode and each of the set of second electrodes 164A-164F may comprise an anode. Electrical current may flow across an LED circuit from an anode to a cathode. This means that electrical current may be configured to flow from second electrode 164A to first electrode 162, electrical current may be configured to flow from second electrode 164B to first electrode 162, electrical current may be configured to flow from second electrode 164C to first electrode 162, electrical current may be configured to flow from second electrode 164D to first electrode 162, electrical current may be configured to flow from second electrode 164E to first electrode 162, and electrical current may be configured to flow from second electrode 164F to first electrode 162. When an electrical current flows from an anode to a cathode corresponding to a pixel, the pixel may be activated and emit light. When electrical current does not flow from an anode to a cathode corresponding to a pixel, the pixel may be deactivated and not emit light. Controller 110 may be configured to individually control whether current flows from each of the second electrodes 164A-164F to first electrode 162.

Figure 5A:
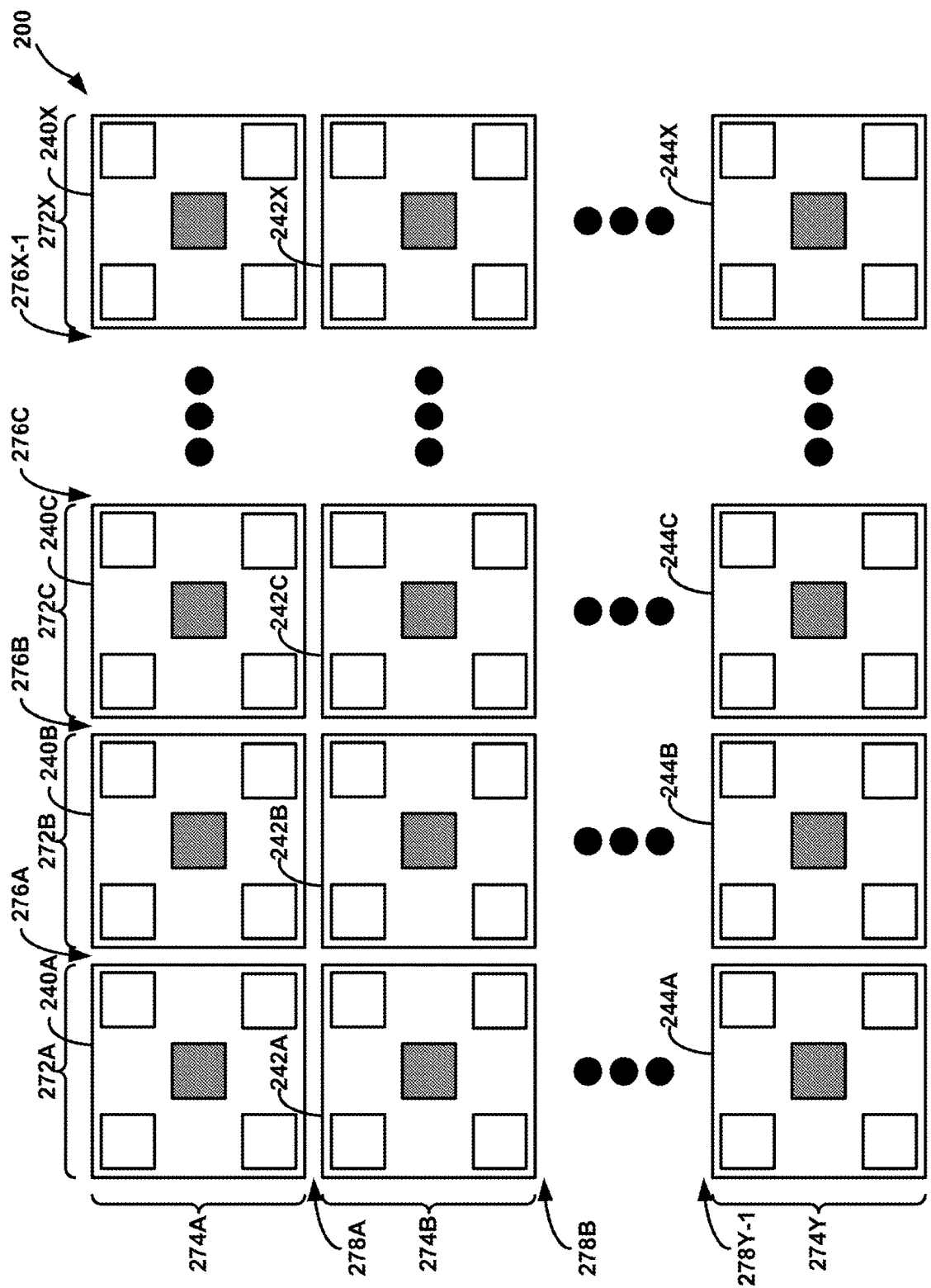
FIGS. 5A-5C are conceptual diagrams each illustrating an example formation of LED circuits of the set of LED circuits of FIGS. 1-2, in accordance with one or more techniques of this disclosure.
Figure 5B:
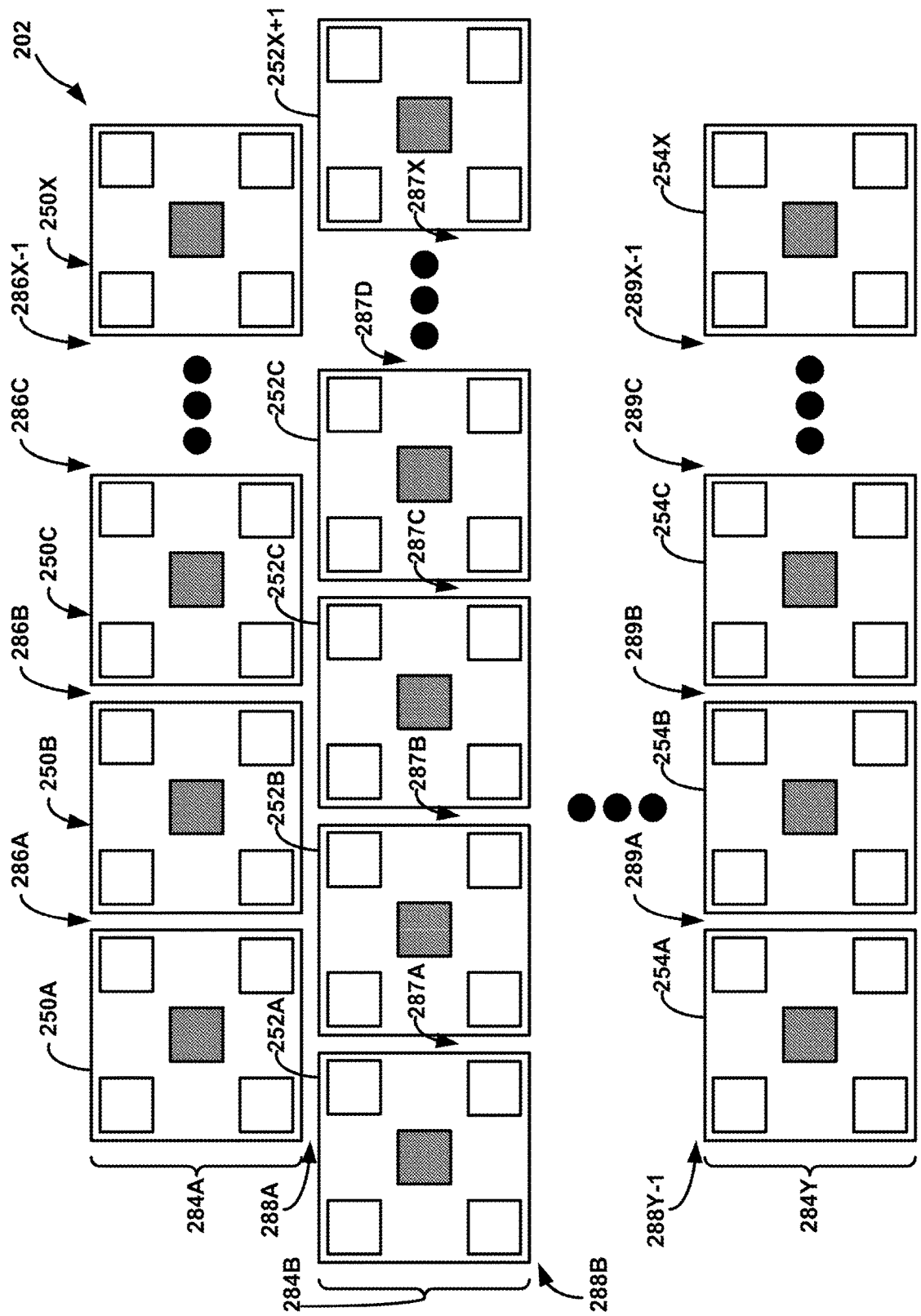
Figure 5C:
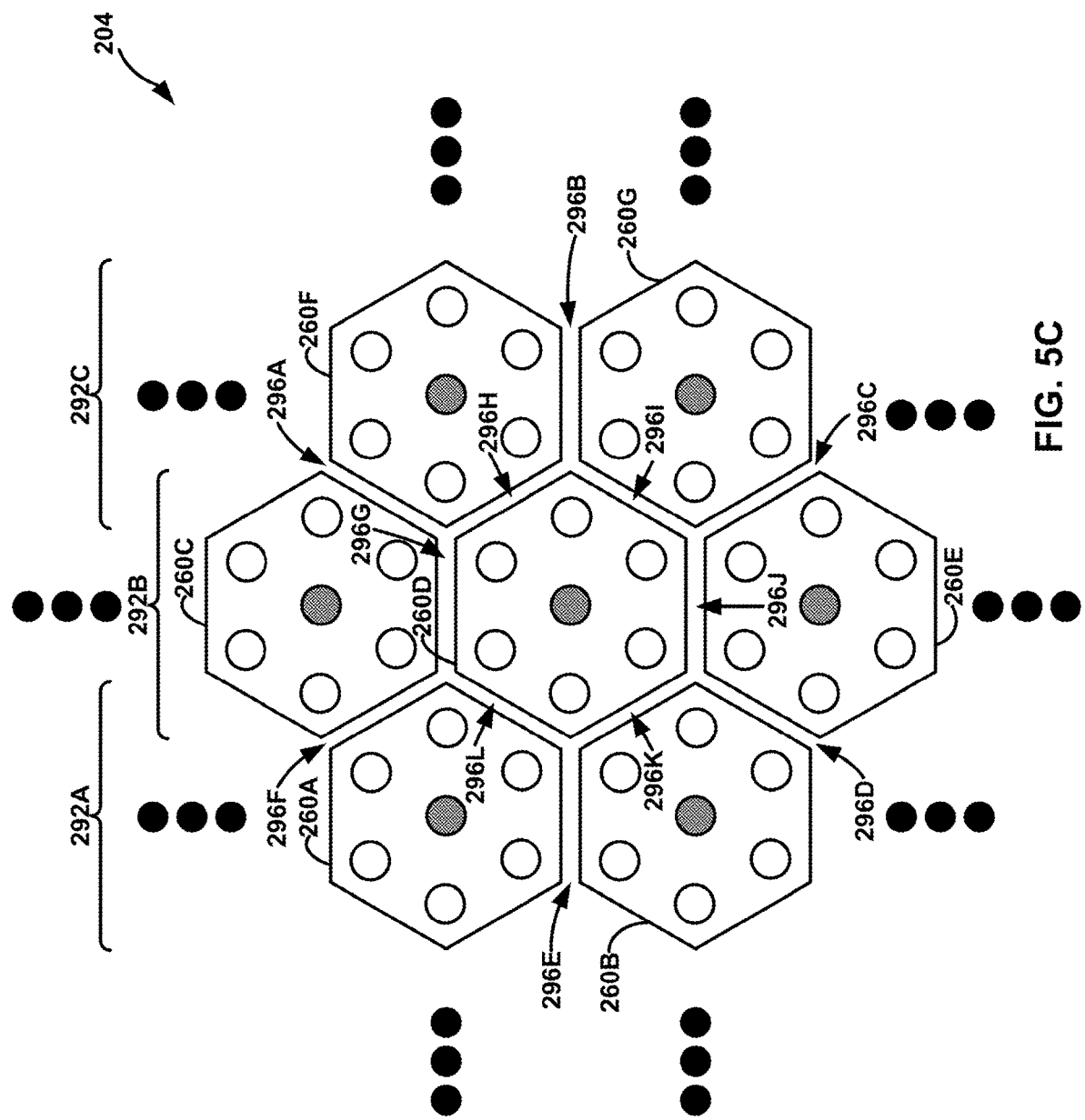

FIGS. 5A-5C are conceptual diagrams each illustrating an example formation of LED circuits of the set of LED circuits 120 of FIGS. 1-2, in accordance with one or more techniques of this disclosure. This disclosure is not limited to the LED circuit formations illustrated in FIGS. 5A-5C. One or more techniques described herein may be performed using formations of LED circuits not illustrated in FIGS. 5A-5C.

FIG. 5A is a conceptual diagram illustrating a first example formation 200 of LED circuits each having four pixels. As seen in FIG. 5A, formation 200 includes LED circuits 240A-240X, LED circuits 242A-242X, and LED circuits 244A-244X. A set of LED circuits including LED circuits 240, 242, 244 may form a set of columns 272A-272X (collectively, "columns 272") of LED circuits and a set of rows 274A-274Y (collectively, "rows 274") of LED circuits. Each LED circuit of LED circuits 240, 242, 244 may represent an example of LED circuit 150 of FIG. 4B. As seen in FIG. 5A, row 274A may include LED circuits 240A-240X, row 274B may include LED circuits 242A-242X, and row 274Y may include LED circuits 244A-244X. In some examples, one or more additional columns may exist between column 272C and column 272X. These additional columns may include LED circuits in addition to the LED circuits 240, 242, 244 shown in FIG. 5A. In some examples, one or more additional rows may exist between row 274B and row 274Y. These additional rows may include LED circuits in addition to the LED circuits 240, 242, 244 shown in FIG. 5A.

Each LED circuit within formation 200 may include a single first electrode and a set of four second electrodes, where the first electrode and the set of second electrodes create four pixels. A controller, such as controller 110, may be configured to individually control whether each pixel of each LED circuit within formation 200 is activated or deactivated. In some examples, a formation similar to formation 200 may be possible for rectangular LED circuits having any number of pixels. For example, a formation of two-pixel LED circuits configured like LED circuit 140 of FIG. 4A may comprise an array having a set of rows and a set of columns.

Columns 272 may form a set of vertical boundaries 276A-276X-1 (collectively, "vertical boundaries 276"). For example, a vertical boundary of vertical boundaries 276 may be located between each pair of adjacent columns of columns 272. That is, vertical boundary 276A is located between column 272A and column 272B, vertical boundary 276B is located between column 272B and column 272C, and so on. Each vertical boundary of vertical boundaries 276 may represent a continuous straight boundary that extends across formation 200 without being interrupted.

Rows 274 may form a set of horizontal boundaries 278A-278Y-1 (collectively, "horizontal boundaries 278"). For example, a horizontal boundary of horizontal boundaries 278 may be located between each pair of adjacent columns of rows 274. That is, horizontal boundary 278A is located between row 274A and row 274B, vertical boundary 276B is located between row 274B and row 274C (not illustrated in FIG. 5A), and so on. Each horizontal boundary of horizontal boundaries 278 may represent a continuous straight boundary that extends across formation 200 without being interrupted.

Since formation 200 includes multi-pixel LED circuits, formation 200 may include fewer brightness variations as compared with formations that include single-pixel LED circuits. This is because brightness variations are unlikely to occur at boundaries between pixels of the same multi-pixel LED circuit. Brightness variations may be significantly more likely to occur at boundaries between LED circuits than at boundaries between pixels of the same LED circuit. This means that some brightness variations may occur at one or more of vertical boundaries 276 and horizontal boundaries 278, but using multi-pixel LED circuits in formation 200 may prevent brightness variations from occurring between pixels on the same LED circuit.

FIG. 5B is a conceptual diagram illustrating a second example formation 202 of LED circuits each having four pixels. As seen in FIG. 5B, formation 202 includes LED circuits 250A-250X, LED circuits 252A-252X, and LED circuits 254A-254X. A set of LED circuits including LED circuits 250, 252, 254 may form a set of rows 284A-284Y (collectively, "rows 284") of LED circuits. Each LED circuit of LED circuits 250, 252, 254 may represent an example of LED circuit 150 of FIG. 4B. As seen in FIG. 5B, row 284A may include LED circuits 250A-250X, row 284B may include LED circuits 252A-252X+1, and row 284Y may include LED circuits 254A-254X. In some examples, one or more additional rows may exist between row 284B and row 284Y. These additional rows may include LED circuits in addition to the LED circuits 250, 252, 254 shown in FIG. 5B.

Formation 202 may comprise overlapped rows of LED circuits. As described herein, the term "overlapped rows" refers to a pair of adjacent rows where each LED circuit of one or the rows overlaps with one or more other LED circuits of the other row. For example, rows 284A and 284B represent overlapped rows. LED circuit 250A of row 284A overlaps with LED circuits 252A and 252B of row 284B, LED circuit 250B of row 284A overlaps with LED circuits 252B and 252C of row 284B, and so on.

Each LED circuit within formation 202 may include a single first electrode and a set of four second electrodes, where the first electrode and the set of second electrodes create four pixels. A controller, such as controller 110, may be configured to individually control whether each pixel of each LED circuit within formation 202 is activated or deactivated. In some examples, a formation similar to formation 202 may be possible for rectangular LED circuits having any number of pixels. For example, a formation of two-pixel LED circuits configured like LED circuit 140 of FIG. 4A may comprise a formation comprising overlapped rows.

Since rows 284 are overlapped in the example of formation 202, vertical boundaries do not extend uninterrupted across the formation. For example, row 284A forms a set of vertical boundaries 286A-286X-1 (collectively, "vertical boundaries 286"), row 284B forms a set of vertical boundaries 287A-287X (collectively, "vertical boundaries 287"), and row 284Y forms a set of vertical boundaries 289A-289X-1 (collectively, "vertical boundaries 289"). Vertical boundaries 286, vertical boundaries 287, and vertical boundaries 289 each extend the length of a single row and are interrupted by one or more LED circuits in an adjacent row. For example, as seen in FIG. 5B, vertical boundary 286A extends from a first end of LED circuits 250A, 250B to a second end of LED circuits 250A, 250B, but is interrupted by LED circuit 252B. As another example, vertical boundary 287A extends from a first end of LED circuits 252A, 252B to a second end of LED circuits 252A, 252B, but is interrupted by LED circuit 250B at the first end and another LED circuit (not illustrated in FIG. 5B) at the second end.

Rows 284 may form a set of horizontal boundaries 288A-288Y-1 (collectively, "horizontal boundaries 288"). For example, a horizontal boundary of horizontal boundaries 288 may be located between each pair of adjacent columns of rows 284. That is, horizontal boundary 278A is located between row 274A and row 274B, vertical boundary 276B is located between row 274B and row 274C (not illustrated in FIG. 5A), and so on. Each horizontal boundary of horizontal boundaries 278 may represent a continuous straight boundary that extends across formation 200 without being interrupted.

LED circuit formations such as formation 202 may produce a lower prevalence of brightness variations as compared with LED circuit formations that include an array of non-overlapping rows and columns (e.g., formation 202 of FIG. 5A). This is because vertical boundaries 286, 287, 289, which extend the width of one row of LED circuits, do not cause brightness variations that are as prevalent as brightness variations caused by boundaries that extend uninterrupted across the entire formation. By overlapping rows of LED circuits, formation 202 eliminates the occurrence of vertical boundaries extending uninterrupted across formation 202, and thus decreases a prevalence of brightness variations.

Since formation 202 includes multi-pixel LED circuits, formation 202 may include fewer brightness variations as compared with formations that include single-pixel LED circuits. This is because brightness variations are unlikely to occur at boundaries between pixels of the same multi-pixel LED circuit. Brightness variations may be significantly more likely to occur at boundaries between LED circuits than at boundaries between pixels of the same LED circuit. This means that some brightness variations may occur at horizontal boundaries 288, but the multi-pixel LED circuits in formation 202 may prevent brightness variations from occurring between pixels on the same LED circuit.

Since formation 202 includes overlapping rows of LED circuits and multi-pixel LED circuits, formation 202 may decrease a prevalence of brightness variations in at least two ways: eliminating vertical boundaries extending uninterrupted across formation 202 and preventing brightness variations between pixels of the same LED circuit. Although continuous horizontal boundaries exist on formation 202, brightness variations may be less prevalent in formation 202 as compared with formations that comprise single-pixel LEDs, and brightness variations may be less prevalent in formation 202 as compared with formations that include non-overlapping rows and columns.

FIG. 5C is a conceptual diagram illustrating a second example formation 204 of LED circuits each having four pixels. As seen in FIG. 5C, formation 204 includes LED circuits 260A-260G (collectively, "LED circuits 260). LED circuits 260 may form a set of columns 292A-292C (collectively, "columns 292") of LED circuits. Each LED circuit of LED circuits 260 may represent an example of LED circuit 160 of FIG. 4C. As seen in FIG. 5C, column 292A may include LED circuits 260A and 260B, column 292B may include LED circuits 260C, 260D, and 260E, and column 292C may include LED circuits 260F and 260G. Formation 204 may, in some examples, extend beyond the columns 292 shown in FIG. 5C. That is, columns 292 may extend above and below the LED circuits 260 shown in FIG. 5C, and there may exist additional columns to the left of columns 292 and additional columns to the right of columns 292. This means that formation 204 may include LED circuits in addition to the LED circuits 260 shown in FIG. 5C.

The LED circuits of formation 204 may form a hexagonal lattice such that each LED circuit of the LED circuits in formation 204 are configured to be adjacent to six other LED circuits of the formation 204. For example, as seen in FIG. 5C, LED circuit 260D is adjacent to each of LED circuits 260A, 260B, 260C, 260E, 260F, and 260G. LED circuit 260A is configured to be adjacent to LED circuits 260B, 260C, 260D, and three other LED circuits not illustrated in FIG. 5C. LED circuit 260B is configured to be adjacent to LED circuits 260A, 260D, 260E, and three other LED circuits not illustrated in FIG. 5C, and so on. Formation 204 may include one or more LED circuits located at edges of formation 204. These LED circuits located at the edges may be adjacent to fewer than six LED circuits.

As seen in FIG. 5C, LED circuits 260 may form boundaries 296A-296L (hereinafter, "boundaries 296"). Boundary 296A is formed between LED circuit 260C and LED circuit 260F, boundary 296B is formed between LED circuit 260F and LED circuit 260G, boundary 296C is formed between LED circuit 260G and LED circuit 260E, boundary 296C is formed between LED circuit 260G and LED circuit 260E, and so on. Furthermore, six boundaries, boundaries 296G-296L, are formed between LED circuit 260D and adjacent LED circuits.

Each LED circuit within formation 204 may include a single first electrode and a set of second second electrodes, where the first electrode and the set of second electrodes create six pixels. A controller, such as controller 110, may be configured to individually control whether each pixel of each LED circuit within formation 204 is activated or deactivated.

Formation 204 includes no straight boundaries that extend continuously across formation 204 without interruption. In some examples, each boundary between LED circuits of formation 204 extends the length of a single side of a hexagonal LED-circuit. For example, boundary 296G is formed between LED circuit 260C and LED circuit 260D. Boundary 296G is interrupted by LED circuit 260A at a first end of boundary 296G, and boundary 296G is interrupted by LED circuit 260F at a first end of boundary 296G. Since a hexagonal lattice represents an interlocked formation of Hexagons without straight boundaries between columns and rows, formation 204 may obviate an existence of uninterrupted straight boundaries across formation 204.

LED circuit formations such as formation 204 may produce cause a lower prevalence of brightness variations as compared with LED circuit formations that include rectangular and/or square LED circuits arranged in one or more rows and/or one or more columns. This is because the boundaries 296 of the hexagonal lattice of formation 204, which extend the width of one side of a hexagon, do not cause brightness variations that are as prevalent as brightness variations caused by boundaries that extend uninterrupted across the entire formation. In other words, formation 204 eliminates both vertical boundaries extending uninterrupted across formation 204 and horizontal boundaries extending uninterrupted across formation 204, and thus decreases a prevalence of brightness variations as compared with formations that include uninterrupted vertical boundaries and/or uninterrupted horizontal boundaries.

Since formation 204 includes multi-pixel LED circuits, formation 204 may include fewer brightness variations as compared with formations that include single-pixel LED circuits. This is because brightness variations are unlikely to occur at boundaries between pixels of the same multi-pixel LED circuit. Brightness variations may be significantly more likely to occur at boundaries between LED circuits than at boundaries between pixels of the same LED circuit. Since formation 204 includes hexagonal LED circuits each having six pixels, formation 204 may include fewer brightness variations as compared with formations that include LED circuits having fewer than six pixels. This is because including a greater number of pixels increases the number of boundaries between pixels of the same LED circuit, which are unlikely to produce brightness variations.

Figure 6:
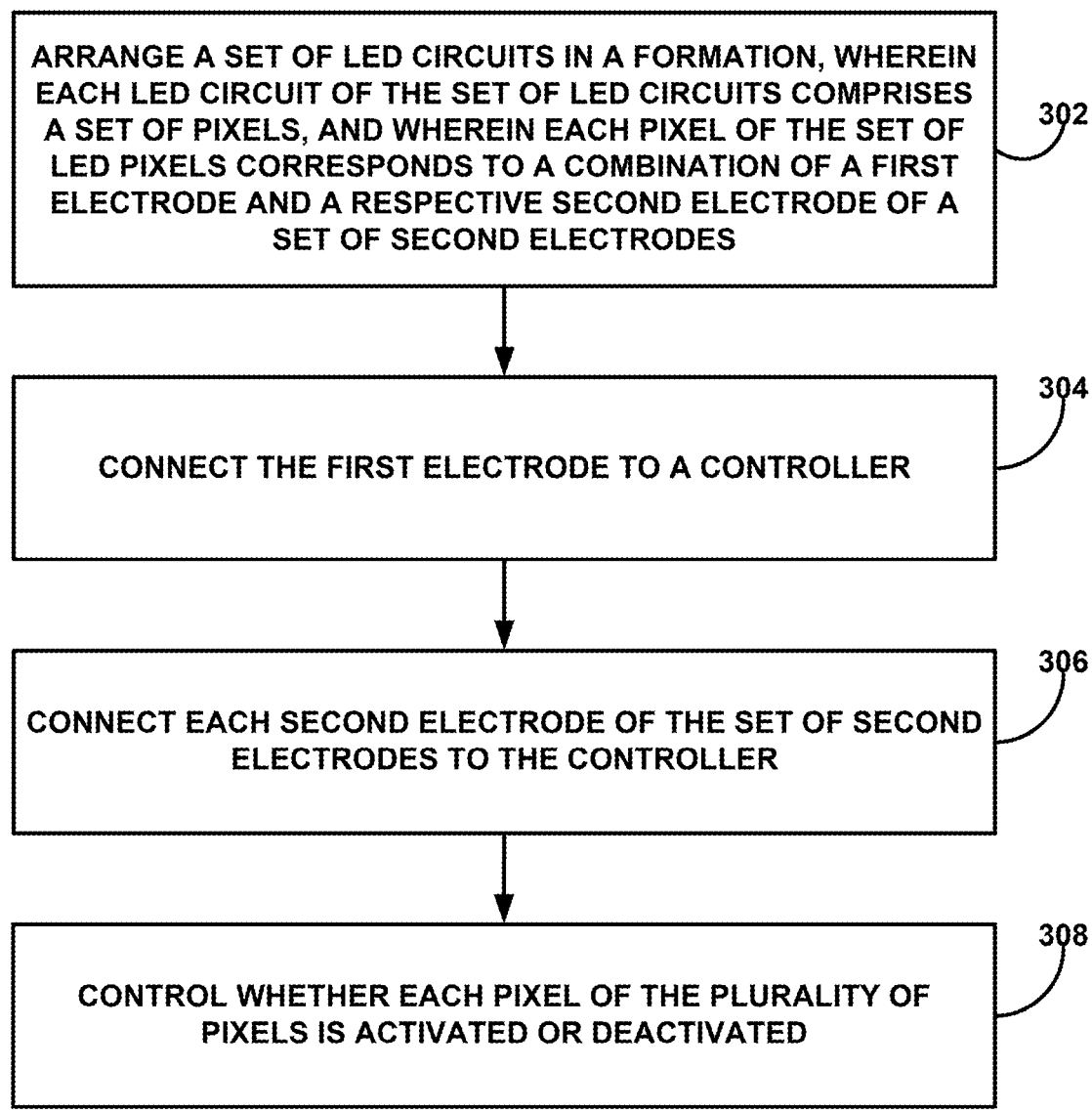
FIG. 6 is a flow diagram illustrating an example operation controlling a set of LED circuits arranged in a formation, in accordance with one or more techniques of this disclosure.

FIG. 6 is a flow diagram illustrating an example operation controlling a set of LED circuits arranged in a formation, in accordance with one or more techniques of this disclosure. FIG. 6 is described with respect to system 100 of FIG. 1. However, the techniques of FIG. 6 may be performed by different components of system 100 or by additional or alternative systems.

A set of LED circuits 120 may be arranged in a formation, wherein each LED circuit of the set of LED circuits comprises a set of pixels, and wherein each pixel of the set of LED pixels corresponds to a combination of a first electrode and a respective second electrode of a set of second electrodes (302). For example, LED circuit 120A may include a first electrode 122A and a set of second electrodes 124A. LED circuit 120A may include a set of pixels each corresponding to a combination of a first electrode 122A and a second electrode of the set of second electrodes 124A.

A first electrode corresponding to each LED circuit of the set of LED circuits 120 may be configured to be connected to controller 110 (304). Each second electrode of the set of second electrodes corresponding to each LED circuit of the set of LED circuits 120 is configured to be connected to controller 110 (306). This means that controller 110 may control whether each pixel of a plurality of pixels of the set of LED circuits 120 is activated or deactivated (308). In some examples, the first electrode corresponding to each LED circuit of the set of LED circuits 120 may be configured to be connected to controller 110 and each second electrode of the set of second electrodes corresponding to each LED circuit of the set of LED circuits 120 is configured to be connected to controller 110 at the same time or within the same period of time.

The following numbered clauses may demonstrate one or more aspects of the disclosure.

Clause 1: A system comprising: a set of light-emitting diode (LED) circuits, wherein each LED circuit of the set of LED circuits comprises: a first electrode; a set of second electrodes; and a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of the respective LED circuit of the set of LED circuits, and wherein each second electrode of the set of second electrodes is located within an outer portion the respective LED circuit of the set of LED circuits. Additionally, the system includes a controller circuit configured to control whether each pixel of the plurality of pixels is activated or deactivated.

Clause 2: The system of clause 1, wherein the first electrode comprises a cathode, and wherein each second electrode of the set of second electrodes comprises an anode.

Clause 3: The system of any of clauses 1-2, wherein when a pixel of the set of pixels is activated: an electrical current is configured to flow from a second electrode of the set of second electrodes corresponding to the pixel to the first electrode; and the electrical current causes the LED circuit to emit light from an area of the LED circuit corresponding to the pixel.

Clause 4: The system of any of clauses 1-3, wherein the set of second electrodes corresponding to each LED circuit of the set of LED circuits comprises two or more second electrodes, and wherein the first electrode corresponding to each LED circuit of the set of LED circuits is located between the two or more second electrodes.

Clause 5: The system of any of clauses 1-4, wherein each LED circuit of the set of LED circuits forms a rectangle, wherein the set of second electrodes corresponding to each LED circuit of the set of LED circuits comprises four second electrodes, and wherein each second electrode of the four second electrodes is located at a corner of the respective LED circuit of the set of LED circuits.

Clause 6: The system of clause 5, wherein the set of LED circuits is arranged in a formation comprising a set of rows and a set of columns, wherein the formation forms a horizontal boundary between each pair of adjacent rows of the set of rows, and wherein the formation forms a vertical boundary between each pair of adjacent columns of the set of columns.

Clause 7: The system of any of clauses 5-6, wherein the set of LED circuits is arranged in formation comprising a set of rows, and wherein each row of the set of rows overlaps with one or more adjacent rows of the set of rows such that each LED circuit within the respective row is configured to form a boundary with two LED circuits within an adjacent row.

Clause 8: The system of any of clauses 1-7, wherein each LED circuit of the set of LED circuits forms a hexagon, wherein the set of second electrodes corresponding to each LED circuit of the set of LED circuits comprises six second electrodes, and wherein each second electrode of the six second electrodes is located at a corner of the respective LED circuit of the set of LED circuits.

Clause 9: The system of clause 8, wherein the set of LED circuits is arranged in a hexagonal lattice.

Clause 10: The system of any of clauses 1-9, wherein the set of LED circuits are configured to be arranged in a formation such that each LED circuit of the set of LED circuits forms a boundary with one or more other LED circuits of the set of LED circuits.

Clause 11: The system of clause 10, wherein the formation forms one or more continuous boundaries between LED circuits that extend across a first dimension of the formation, and wherein the formation comprises one or more continuous boundaries between LED circuits that extend across a second dimension of the formation.

Clause 12: The system of any of clauses 10-11, wherein the formation forms one or more continuous boundaries between LED circuits that extend across a first dimension of the formation, and wherein overlapping LED circuits along the first dimension of the formation prevent continuous boundaries from extending across the second dimension of the formation.

Clause 13: The system of any of clauses 10-12, wherein the set of LED circuits are configured to be arranged in a lattice such that no continuous boundaries between LED circuits extend across the lattice.

Clause 14: The system of any of clauses 1-13, wherein the circuit further comprises: a first set of conductive connectors, wherein each conductive connector of the first set of conductive connectors connects a respective first electrode of the plurality of LED circuits to the controller circuit; and a second set of conductive connectors, wherein each conductive connector of the second set of conductive connectors connects a respective second electrode of the plurality of LED circuits to the controller circuit.

Clause 15: The system of clause 14, wherein the plurality of LED circuits are located in a first plane, wherein the first set of conductive connectors and the second set of conductive connectors are located in a second plane adjacent to the first plane, and wherein the controller circuit is located in a third plane adjacent to the second plane, the second plane located between the first plane and the third plane.

Clause 16: The system of any of clauses 14-15, wherein to control a pixel of the plurality of pixels to be activated, the controller circuit is configured to cause an electrical current to flow through a respective conductive connector of the second set of conductive connectors to a second electrode corresponding to the pixel.

Clause 17: The system of any of clauses 14-16, wherein to control a pixel of the plurality of pixels to be deactivated, the controller circuit is configured to prevent an electrical current from flowing through a respective conductive connector of the second set of conductive connectors to a second electrode corresponding to the pixel.

Clause 18: A light-emitting diode (LED) circuit comprising: a first electrode; a set of second electrodes; and a set of pixels, wherein each pixel of the set of pixels corresponds to a combination of the first electrode and a respective second electrode of the set of second electrodes, wherein the first electrode is located within a center portion of the LED circuit, and wherein each second electrode of the set of second electrodes is located within an outer portion the LED circuit.

Clause 19: The LED circuit of clause 18, wherein the first electrode comprises a cathode, and wherein each second electrode of the set of second electrodes comprises an anode.

Clause 20: A method comprising: controlling, by a controller circuit, whether each pixel of a plurality of pixels is activated or deactivated, wherein each LED circuit of a set of LED circuits comprises: a first electrode; a set of second electrodes; and a set of pixels, wherein each pixel of the set of pixels corresponds to a combination of the first electrode and a respective second electrode of the set of second electrodes, wherein the plurality of pixels includes the set of pixels corresponding to each LED circuit of the set of LED circuits, wherein the first electrode is located within a center portion of the respective LED circuit of the set of LED circuits, and wherein each second electrode of the set of second electrodes is located within an outer portion the respective LED circuit of the set of LED circuits.

Clause 21: A system comprising a set of light-emitting diode (LED) circuits, wherein each LED circuit of the set of LED circuits comprises: a first electrode; a set of second electrodes; and a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of the respective LED circuit of the set of LED circuits, and wherein each second electrode of the set of second electrodes is located within an outer portion the respective LED circuit of the set of LED circuits.

The techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

Various examples have been described. These and other examples are within the scope of the following claims.

What is claimed is:

1. A system comprising:
a set of light-emitting diode (LED) circuits, wherein each LED circuit of the set of LED circuits forms a rectangle, and wherein each LED circuit of the set of LED circuits comprises:
a first electrode located on the rectangle;
a set of second electrodes located on the rectangle, wherein the set of second electrodes comprises four second electrodes; and
a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of a respective LED circuit of the set of LED circuits, the center portion located on a center of the rectangle of the respective LED circuit, wherein the center of the rectangle is displaced from each edge of a set of edges of the rectangle of the respective LED circuit, and wherein each second electrode of the set of second electrodes is located within an outer portion of the respective LED circuit of the set of LED circuits at a corner of the respective LED circuit of the set of LED circuits, wherein the outer portion is displaced from the center of the rectangle of the respective LED circuit; and a controller circuit configured to control whether each pixel of the plurality of pixels is activated or deactivated.

2. The system of claim 1, wherein the first electrode comprises a cathode, and wherein each second electrode of the set of second electrodes comprises an anode.

3. The system of claim 1, wherein when a pixel of the set of pixels is activated:
an electrical current is configured to flow from a second electrode of the set of second electrodes corresponding to the pixel to the first electrode; and
the electrical current causes the LED circuit to emit light from an area of the LED circuit corresponding to the pixel.

4. The system of claim 1,
wherein the set of LED circuits is arranged in a formation comprising a set of rows and a set of columns,
wherein the formation forms a horizontal boundary between each pair of adjacent rows of the set of rows, and
wherein the formation forms a vertical boundary between each pair of adjacent columns of the set of columns.

5. The system of claim 1,
wherein the set of LED circuits is arranged in formation comprising a set of rows, and
wherein each row of the set of rows overlaps with one or more adjacent rows of the set of rows such that each LED circuit within the respective row is configured to form a boundary with two LED circuits within an adjacent row.

6. The system of claim 1, wherein the set of LED circuits are configured to be arranged in a formation such that each LED circuit of the set of LED circuits forms a boundary with one or more other LED circuits of the set of LED circuits.

7. The system of claim 6,
wherein the formation forms one or more continuous boundaries between LED circuits that extend across a first dimension of the formation, and
wherein the formation comprises one or more continuous boundaries between LED circuits that extend across a second dimension of the formation.

8. The system of claim 6,
wherein the formation forms one or more continuous boundaries between LED circuits that extend across a first dimension of the formation, and
wherein overlapping LED circuits along the first dimension of the formation prevent continuous boundaries from extending across the second dimension of the formation.

9. The system of claim 6, wherein the set of LED circuits are configured to be arranged in a lattice such that no continuous boundaries between LED circuits extend across the lattice.

10. The system of claim 1, wherein the circuit further comprises:
a first set of conductive connectors, wherein each conductive connector of the first set of conductive connectors connects a respective first electrode of the plurality of LED circuits to the controller circuit; and
a second set of conductive connectors, wherein each conductive connector of the second set of conductive connectors connects a respective second electrode of the plurality of LED circuits to the controller circuit.

11. The system of claim 10,
wherein the plurality of LED circuits are located in a first plane,
wherein the first set of conductive connectors and the second set of conductive connectors are located in a second plane adjacent to the first plane, and
wherein the controller circuit is located in a third plane adjacent to the second plane, the second plane located between the first plane and the third plane.

12. The system of claim 10, wherein to control a pixel of the plurality of pixels to be activated, the controller circuit is configured to cause an electrical current to flow through a respective conductive connector of the second set of conductive connectors to a second electrode corresponding to the pixel.

13. The system of claim 10, wherein to control a pixel of the plurality of pixels to be deactivated, the controller circuit is configured to prevent an electrical current from flowing through a respective conductive connector of the second set of conductive connectors to a second electrode corresponding to the pixel.

14. A light-emitting diode (LED) circuit comprising:
a first electrode located on a rectangle;
a set of second electrodes located on the rectangle, wherein the set of second electrodes comprises four second electrodes; and
a set of pixels, wherein each pixel of the set of pixels corresponds to a combination of the first electrode and a respective second electrode of the set of second electrodes,
wherein the first electrode is located within a center portion of the LED circuit, the center portion located on a center of the rectangle of the LED circuit, wherein the center of the rectangle is displaced from each edge of a set of edges of the rectangle of the LED circuit, and
wherein each second electrode of the set of second electrodes is located within an outer portion of the LED circuit at a corner of the LED circuit, wherein the outer portion is displaced from the center of the rectangle of the LED circuit.

15. The LED circuit of claim 14, wherein the first electrode comprises a cathode, and wherein each second electrode of the set of second electrodes comprises an anode.

16. A method comprising:
controlling, by a controller circuit, whether each pixel of a plurality of pixels is activated or deactivated,
wherein each light-emitting diode (LED) circuit of a set of LED circuits comprises:
a first electrode located on a rectangle;
a set of second electrodes located on the rectangle, wherein the set of second electrodes comprises four second electrodes; and a set of pixels, wherein each pixel of the set of pixels corresponds to a combination of the first electrode and a respective second electrode of the set of second electrodes, wherein the plurality of pixels includes the set of pixels corresponding to each LED circuit of the set of LED circuits, wherein the first electrode is located within a center portion of a respective LED circuit of the set of LED circuits, the center portion located on a center of the rectangle of the respective LED circuit, wherein the center of the rectangle is displaced from each edge of a set of edges of the rectangle of the respective LED circuit, and wherein each second electrode of the set of second electrodes is located within an outer portion of the respective LED circuit of the set of LED circuits at a corner of the respective LED circuit of the set of LED circuits, wherein the outer portion is displaced from the center of the rectangle of the respective LED circuit.

17. A system comprising a set of light-emitting diode (LED) circuits, wherein each LED circuit of the set of LED circuits comprises:

a first electrode located on a rectangle;

a set of second electrodes located on the rectangle, wherein the set of second electrodes comprises four second electrodes; and a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of a respective LED circuit of the set of LED circuits, the center portion located on a center of the rectangle of the respective LED circuit, wherein the center of the rectangle is displaced from each edge of a set of edges of the rectangle of the respective LED circuit, and wherein each second electrode of the set of second electrodes is located within an outer portion of the respective LED circuit of the set of LED circuits at a corner of the respective LED circuit of the set of LED circuits, wherein the outer portion is displaced from the center of the rectangle of the respective LED circuit.

18. A system comprising:

a set of light-emitting diode (LED) circuits, wherein each LED circuit of the set of LED circuits forms a hexagon wherein each LED circuit of the set of LED circuits comprises:

a first electrode located on the hexagon;

a set of second electrodes located on the hexagon, wherein the set of second electrodes comprises six second electrodes; and a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of a respective LED circuit of the set of LED circuits, the center portion located on a center of the hexagon of the respective LED circuit, wherein the center of the hexagon is displaced from each edge of a set of edges of the hexagon of the respective LED circuit, and wherein each second electrode of the set of second electrodes is located within an outer portion of the respective LED circuit of the set of LED circuits at a corner of the respective LED circuit of the set of LED circuits, wherein the outer portion is displaced from the center of the hexagon of the respective LED circuit; and a controller circuit configured to control whether each pixel of the plurality of pixels is activated or deactivated.

19. The system of claim 18, wherein the set of LED circuits is arranged in a hexagonal lattice.

20. A light-emitting diode (LED) circuit comprising:

a first electrode located on a hexagon;

a set of second electrodes located on the hexagon, wherein the set of second electrodes comprises six second electrodes; and a set of pixels, wherein each pixel of the set of pixels corresponds to a combination of the first electrode and a respective second electrode of the set of second electrodes, wherein the first electrode is located within a center portion of the LED circuit, the center portion located on a center of the hexagon of the LED circuit, wherein the center of the hexagon is displaced from each edge of a set of edges of the hexagon of the LED circuit, and wherein each second electrode of the set of second electrodes is located within an outer portion of the LED circuit at a corner of the LED circuit, wherein the outer portion is displaced from the center of the hexagon of the LED circuit.

21. A system comprising a set of light-emitting diode (LED) circuits, wherein each LED circuit of the set of LED circuits comprises:

a first electrode located on a hexagon;

a set of second electrodes located on the hexagon, wherein the set of second electrodes comprises six second electrodes; and a set of pixels, wherein each pixel of the set of pixels corresponds to a combination of the first electrode and a respective second electrode of the set of second electrodes, wherein a plurality of pixels includes the set of pixels corresponding to each LED circuit of the set of LED circuits, wherein the first electrode is located within a center portion of a respective LED circuit of the set of LED circuits, the center portion located on a center of the hexagon of the respective LED circuit, wherein the center of the hexagon is displaced from each edge of a set of edges of the hexagon of the respective LED circuit, and wherein each second electrode of the set of second electrodes is located within an outer portion of the respective LED circuit of the set of LED circuits at a corner of the respective LED circuit of the set of LED circuits, wherein the outer portion is displaced from the center of the hexagon of the respective LED circuit.

* * * * *